United States Patent
Min et al.

(10) Patent No.: US 8,169,816 B2
(45) Date of Patent: May 1, 2012

(54) FABRICATION METHODS OF PARTIAL CLADDED WRITE LINE TO ENHANCE WRITE MARGIN FOR MAGNETIC RANDOM ACCESS MEMORY

(75) Inventors: Tai Min, San Jose, CA (US); Wai-Ming J. Kan, San Ramon, CA (US); David Heim, Redwood City, CA (US); Chyu Jiuh Torng, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 375 days.

(21) Appl. No.: 12/584,952

(22) Filed: Sep. 15, 2009

(65) Prior Publication Data

US 2011/0062536 A1    Mar. 17, 2011

(51) Int. Cl.
*G11C 11/00* (2006.01)
(52) U.S. Cl. .................. 365/158; 365/148; 365/171
(58) Field of Classification Search ........... 257/E21.665, 257/421; 365/48, 55, 62, 66, 74, 78, 80–93, 365/100, 130, 131, 148, 158, 171–173, 209, 365/213, 225.5, 230.07, 232, 243.5
See application file for complete search history.

(56) References Cited

U.S. PATENT DOCUMENTS

| | | | |
|---|---|---|---|
| 5,650,958 A | 7/1997 | Gallagher et al. | |
| 5,659,499 A | 8/1997 | Chen et al. | |
| 5,940,319 A | 8/1999 | Durlam et al. | |
| 6,211,090 B1 | 4/2001 | Durlam et al. | |
| 6,335,890 B1 * | 1/2002 | Reohr et al. | 365/225.5 |
| 6,490,217 B1 | 12/2002 | DeBrosse et al. | |
| 6,555,858 B1 | 4/2003 | Jones et al. | |
| 6,798,690 B1 | 9/2004 | Katti | |
| 6,798,691 B1 | 9/2004 | Ounadjela et al. | |
| 6,927,072 B2 | 8/2005 | Molla et al. | |
| 6,969,895 B2 | 11/2005 | Han et al. | |
| 7,304,360 B2 | 12/2007 | Guo et al. | |
| 7,443,707 B2 | 10/2008 | Guo et al. | |
| 7,706,175 B2 * | 4/2010 | Hosotani et al. | 365/158 |
| 7,932,513 B2 * | 4/2011 | Hosotani et al. | 257/30 |
| 8,009,464 B2 * | 8/2011 | Kajiyama | 365/158 |

(Continued)

OTHER PUBLICATIONS

"Switching Field Variation in Patterned Submicron Magnetic Film Elements," by Youfeng Zheng et al., Journal of Applied Physics, vol. 81, No. 8, Apr. 15, 1997, American Institute of Physics, pp. 5471-5473.

(Continued)

*Primary Examiner* — Michael Shingleton
(74) *Attorney, Agent, or Firm* — Saile Ackerman LLC; Stephen B. Ackerman

(57) ABSTRACT

A cladding structure for a conductive line used to switch a free layer in a MTJ is disclosed and includes two cladding sidewalls on two sides of the conductive line, a top cladding portion on a side of the conductive line facing away from the MTJ, and a highly conductive, non-magnetic spacing control layer formed between the MTJ and conductive line. The spacing control layer has a thickness of 0.02 to 0.12 microns to maintain the distance separating free layer and conductive line between 0.03 and 0.15 microns. The spacing control layer is aligned parallel to the conductive line and contacts a plurality of MTJ elements in a row of MRAM cells. Half-select error problems are avoided while maintaining high write efficiency. A spacing control layer may be formed between a word line and a bottom electrode in a top pinned layer or dual pinned layer configuration.

34 Claims, 9 Drawing Sheets

U.S. PATENT DOCUMENTS

| | | | |
|---|---|---|---|
| 8,098,514 B2 * | 1/2012 | Nagase et al. | 365/158 |
| 2005/0167770 A1 | 8/2005 | Fukuzawa et al. | |
| 2005/0208681 A1 | 9/2005 | Meixner et al. | |
| 2006/0023492 A1 | 2/2006 | Min et al. | |
| 2006/0077707 A1 | 4/2006 | Deak | |
| 2007/0002609 A1 | 1/2007 | Chung et al. | |
| 2007/0014146 A1 | 1/2007 | Guo et al. | |
| 2008/0253178 A1 | 10/2008 | Min et al. | |
| 2009/0057794 A1 | 3/2009 | Guo et al. | |
| 2009/0218645 A1 | 9/2009 | Ranjan et al. | |

OTHER PUBLICATIONS

"A Low Power 1Mbit MRAM based on 1T1MTJ Bit Cell Integrated with Copper Interconnects," by M. Durlam et al., VLSI Conference (2002), Motorola Semiconductor Products Sector and Motorola Labs, Tempe, Arizona, pp. 1-22.

PCT/US 10/02495 International Search Report, Nov. 3, 2010, Magic Technologies, Inc.

* cited by examiner

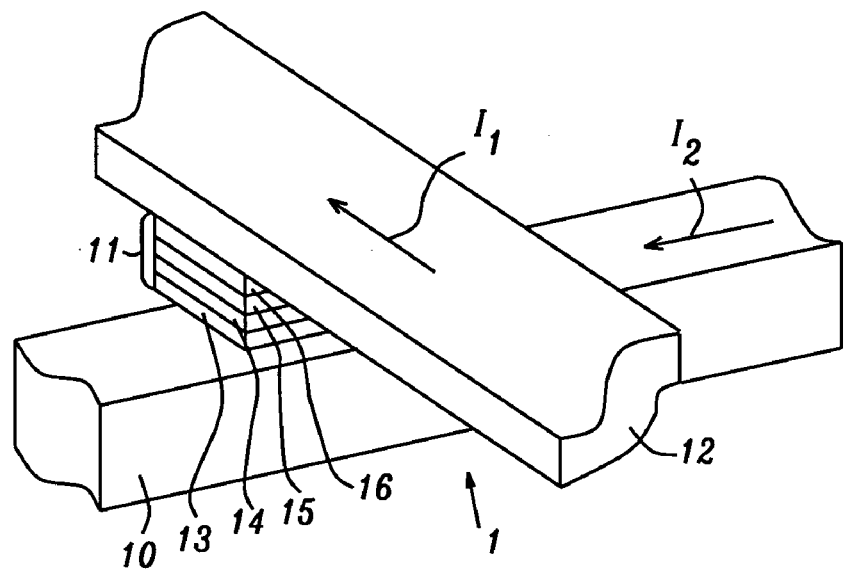
FIG. 1 – Prior Art
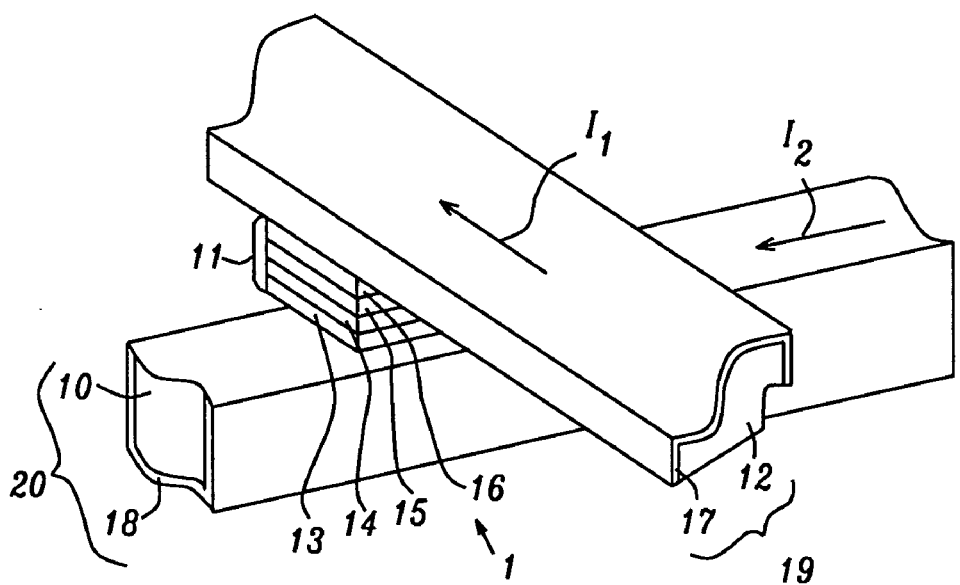
FIG. 2 – Prior Art

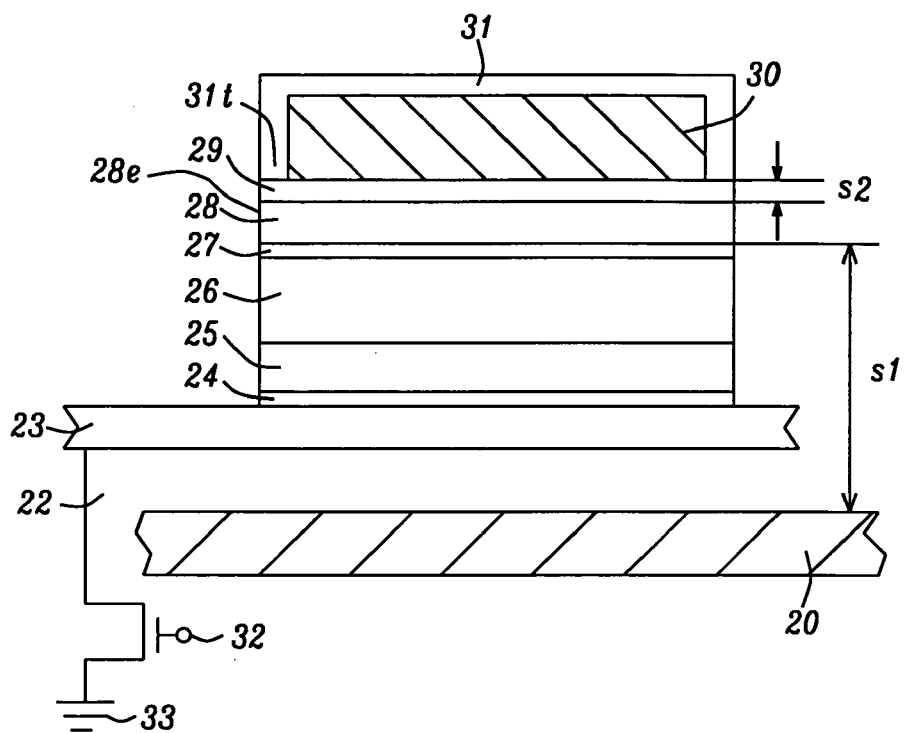
FIG. 3 – Prior Art
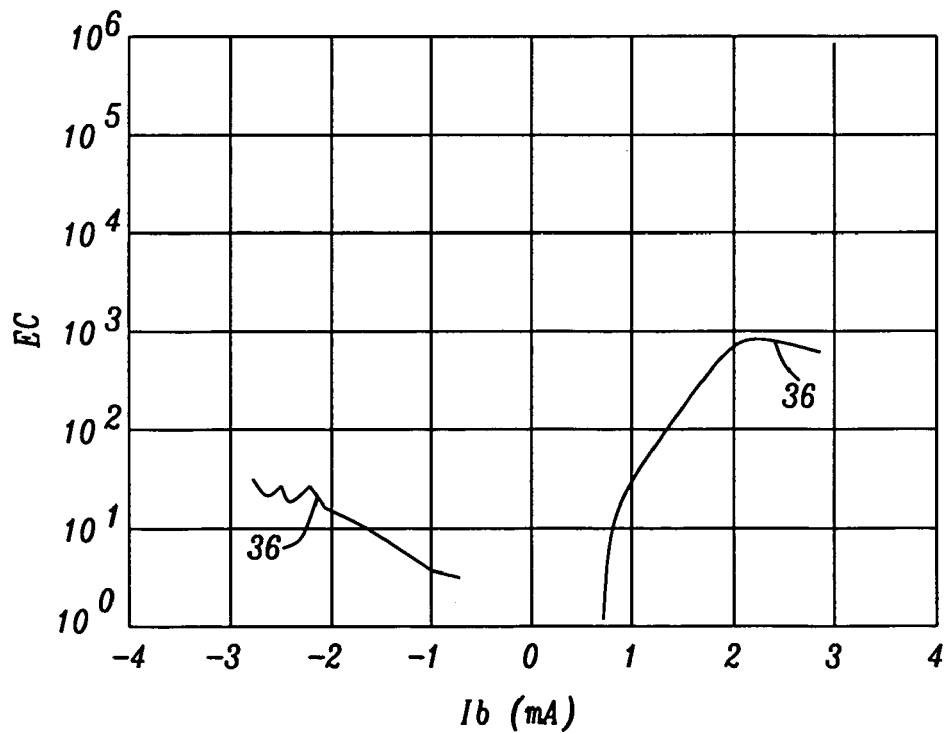
FIG. 4 – Prior Art

FABRICATION METHODS OF PARTIAL CLADDED WRITE LINE TO ENHANCE WRITE MARGIN FOR MAGNETIC RANDOM ACCESS MEMORY

RELATED PATENT APPLICATION

This application is related to U.S. Patent Application Publication 2008/0253178, Ser. No. 11/787,330, filing date Apr. 16, 2007; assigned to the same assignee as the current invention and which is herein incorporated by reference in its entirety.

FIELD OF THE INVENTION

The invention relates to an MRAM design, and in particular, to a MRAM structure wherein a spacing control layer with a tightly controlled thickness is formed between a MTJ stack of layers and a cladded bit line or cladded word line to solve the half-selected bit disturb problem without sacrificing writing efficiency. A method is also provided for fabricating the aforementioned MRAM structure.

BACKGROUND OF THE INVENTION

Magnetic random access memory (MRAM) that incorporates a magnetic tunneling junction (MTJ) as a memory storage cell is a strong candidate to provide a high density, fast (1-30 ns read/write speed), and non-volatile storage solution for future memory applications. An MRAM array is generally comprised of an array of parallel first conductive lines on a horizontal plane, an array of parallel second conductive lines on a second horizontal plane spaced above and formed in a direction perpendicular to the first conductive lines, and an MTJ formed at each location where a second conductive line crosses over a first conductive line. A first conductive line may be a word line while a second conductive line is a bit line or vice versa. Alternatively, the first conductive line may be a sectioned line which is a bottom electrode or a stud that connects the MTJ to a transistor.

Referring to FIG. 1, a conventional MRAM structure 1 is shown in which an MTJ 11 is formed between a first conductive line 10 and a second conductive line 12. In this example, the first conductive line is a word line and the second conductive line is a bit line although the terms are interchangeable. A conductive line may also be referred to as a digit line, row line, data line or column line. The word line 10 and bit line 12 are used for writing data into the MTJ 11. The MTJ consists of a stack of layers with a configuration in which two ferromagnetic layers are separated by a thin non-magnetic insulating layer such as $Al_2O_3$, $AlN_xO_y$, or MgO which is called a tunnel barrier layer. In a so-called bottom pinned layer configuration, the bottom portion 13 is a composite layer with a lower seed layer, a middle anti-ferromagnetic (AFM) layer, and an upper pinned layer. The AFM layer as described in U.S. Pat. No. 5,650,958 is exchange coupled to the pinned layer and thereby fixes the magnetization (magnetic moment) direction of the pinned layer in a preset direction. Above the pinned layer is the tunnel barrier layer 14. The second ferromagnetic layer is a free layer 15 on the tunnel barrier layer and has a magnetization direction which can be changed by external magnetic fields. To maintain data against erasure or thermal agitation, an in-plane uni-axial magnetic anisotropy is needed for the magnetic free layer 15. The top layer in the MTJ 11 is generally a cap layer 16.

In a read operation, the information is read by sensing the magnetic state (resistance level) of the MTJ through a sense current flowing through the MTJ, typically in a current perpendicular to plane (CPP) configuration. When the magnetic vector of the free layer 15 is oriented parallel to that of the pinned layer, there is a lower resistance for current passing through the tunnel barrier layer 14 than when the free layer and pinned layer have magnetic vectors in anti-parallel directions.

During a write operation, an electrical current $I_1$ in bit line 12 and a current $I_2$ in word line 10 yield two magnetic fields on the free layer 15. The magnetic fields conform to a right hand rule so that a first field is generated along a first axis (easy axis) in the plane of the free layer and a second field is produced in a direction orthogonal to the first axis (hard axis) in the free layer. In response to the magnetic field generated by current $I_1$, the magnetic vector in the free layer is oriented in a particular stable direction. The resulting magnetic vector orientation depends on the direction and magnitude of $I_1$ and $I_2$ and the properties and shape of the free layer 15. Generally, writing a zero (0) requires the direction of $I_1$ to be different than when writing a one (1).

One challenge associated with MRAM structures is not to disturb the so-called half selected bits under conductive lines (word line/bit line) that are not intended for programming. The free layer magnetic anisotropy is formed by deviating its shape from a circular shape to an elliptical shape from a top view (not shown). One method to solve the half select bit problem is by increasing the magnetic anisotropy. However, this method will increase the writing current proportionally which is not desired for high density memory devices.

The prior art including U.S. Patent Application 2008/0253178, U.S. Pat. No. 6,335,890, U.S. Pat. No. 6,490,217, U.S. Pat. No. 6,798,690, and U.S. Pat. No. 6,798,691 teach how to solve the half-selected bits issue without greatly increasing the programming current. MTJ cells with a general "C-like" shape can force the magnetization switching along the easy axis into a c-mode which has a much higher coercivity to avoid the half-select bit problem as explained by Y. Zheng et al. in "Switching field variation in patterned submicron magnetic film elements", J. Appl. Phys. 81(8), 15, p. 5471 (1997).

Another concern related to high density memory is that the transistor size limits the supply of available currents. The magnitude of the magnetic field used to switch the magnetic vector is proportional to the magnitude of $I_1$ and $I_2$. The amplitude of $I_1$ and $I_2$ is on the order of several milli-Amperes for most designs. It is desirable to reduce power consumption and this adjustment is achieved in some cases by increasing the field per current ratio of the conductor. A prior art method for increasing the field per current ratio is to provide a cladding layer on one or more sides of a conductive line. Examples of cladding layers are described by Naji et al. in "A low power 1 Mbit MRAM based on ITIMTJ bit cell integrated with Copper Interconnects", VLSI Conf. (2002). Other cladding designs are taught in U.S. Pat. No. 5,659,499, U.S. Pat. No. 5,940,319, U.S. Pat. No. 6,211,090, U.S. Pat. No. 6,927,072, U.S. Pat. No. 7,304,360, and in U.S. Pat. No. 7,443,707.

U.S. Pat. No. 6,555,858 teaches the formation of an etch stop layer that is coplanar with a top electrode in a MTJ element before forming a bit line thereon. There is no description of how to control the thickness of the top electrode or the distance between a free layer and an overlying bit line.

Ferromagnetic cladding layers are known to increase the current induced magnetic switching field applied to magnetic elements such as MTJs configured either above or below a metal line having such a cladding layer and thereby reduce the current necessary to produce a switching field. As a result, switching word line transistors can also be made smaller. As the size of MTJs shrinks to 0.1 micron or smaller, the switching fields are expected to become larger and switch transistors will demand a larger amount of chip area.

Referring to FIG. 2, a conventional MRAM 1 with a magnetic cladding design is shown in which a word line 19 is comprised of two parts that are an electrically conductive inner core 10 such as Cu and a soft magnetic cladding layer 17. Likewise, a bit line 20 may be comprised of a copper inner core 12 and a soft magnetic cladding layer 18 formed thereon. The cladding layers are used to focus the magnetic flux associated with and $I_2$ onto MTJ 11 and reduce the magnetic field on the conductive line surfaces which are not facing the MTJ. Ferromagnetic cladding layers are typically made by forming a ferromagnetic layer on one or more sides of a metal line. Note that the cladding layers 17, 18 are not formed on a side of a conductive line that faces the MTJ 11. The magnetization of the cladding layers 17, 18 are along the long axis of the lines 19, 20, respectively, thereby creating poles at both ends of the lines. The fringing field at such poles can reach 50 to 300 Gauss in magnitude.

Referring to FIG. 3, a conventional MRAM is depicted with a stack of MTJ layers 24-29 formed between a bottom electrode 23 and a bit line 30 with a magnetic cladding layer 31. There is a dielectric layer 22 separating the bottom electrode 23 from a word line 20 having a cladding layer 21. In this case, a seed layer 24, AFM layer 25, pinned layer 26, tunnel barrier layer 27, free layer 28, and a capping layer 29 are sequentially formed on bottom electrode 23. The bottom electrode 23 is connected to ground 33 through a transistor 32. Magnetic field strength decreases rapidly as the distance s1 between the free layer 28 and word line 20 increases and as the distance s2 between the free layer and bit line 30 increases. Therefore the spacing s1 and s2 is minimized in order to enhance write efficiency. The spacing s1 and/or s2 must be thin and precisely controlled to reduce the spacing variation that causes write efficiency variation. Thus, it is desirable for the bit line/word line to be deposited on a very flat surface and a capping layer 29 having a well controlled thickness on top of the MTJ stack. U.S. Pat. No. 6,969,895 teaches a method utilizing a CMP process to create a flat surface and capping layer thickness on a MTJ stack for tight and precise control of bit line to free layer spacing thereby allowing the bit line to be placed very close to the free layer in the MTJ stack which maximizes writing efficiency.

Unfortunately, the magnetic interaction between ends 28e of the free layer 28 and regions 31f of the cladding layer 31 proximate to the capping layer 29 can lower the switching threshold which results in high tendency for half-selected bits to be disturbed into the wrong state. When the spacing between the bit line/word line and free layer becomes smaller, this magnetic interaction becomes stronger. This interaction is more pronounced if the MTJ has a c-like shape that is used to increase coercivity and the magnetization switching will not follow c-mode switching. Thus, severe half-select error rates can happen and were indeed observed as shown by the data in FIG. 4 measured from several 4 Mb chips. Line 36 represents one chip based on a "c-like" MTJ design and shows a large error count (EC) was observed after a 1000× bit line write disturb in which a write current was applied 1000 times in ~10 ns pulses. Therefore, an improved MRAM architecture is needed that solves the half-select bit disturb issue without compromising the high write efficiency of placing a cladded bit line/word line proximate to a free layer in a MTJ.

SUMMARY OF THE INVENTION

One objective of the present invention is to provide a cladding design for a write or bit line proximate to a free layer in a MTJ that solves the half-select bit disturb problem without sacrificing the writing power of the write line or bit line to switch a magnetization direction in the free layer.

A further objective of the present invention is to provide a method of forming the cladding layer structure according to the first objective.

These objectives are realized in an MRAM structure comprised of a plurality of MRAM cells each including a MTJ element, and a first conductive line which is a word line or bit line that is formed proximate to a free layer in each of the MTJ elements along a certain row of MTJs. In a preferred embodiment, the first conductive line has a cladding layer made of NiFe or an alloy of Ni, Fe, or Co formed on two sides that are perpendicular to the planes of the MTJ layers and on a side facing away from the MTJ elements. The spacing separating each of the free layers from the first conductive line is tightly controlled to be thicker than a minimum value of 0.03 microns in order to reduce the magnetic coupling between the free layer and magnetic cladding layer on two sides of the first conductive line thereby avoiding the half-select error problem. Furthermore, the spacing is kept below 0.15 microns so that the magnetic field generated by the first conductive line at the free layer in one or more selected MTJ elements is not significantly reduced and a high writing efficiency is maintained. In one aspect, each of the MTJ elements has a bottom pinned layer structure in which a seed layer, AFM layer, pinned layer, tunnel barrier layer, free layer, and capping layer are sequentially formed on a bottom conductor. The capping layer may be a composite including an upper hard mask layer.

There is a spacing control layer aligned parallel with the first conductive line and having a bottom surface that contacts the top surface of the capping layer in each of the MTJ elements in said row of MTJs. The spacing control layer is considered to be part of the first conductive line structure and has a top surface which adjoins a side of the first conductive line facing the capping layer along a substantial distance of the first conductive line. Preferably, the spacing control layer has a thickness from 0.02 to 0.12 microns and is made of a highly conductive, non-magnetic material such as Cu, Al, Au, Ag, CuAg, Ta, Cr, NiCr, NiFeCr, Ru, Rh, W, or multi-layers or laminates thereof such as (NiCr/Cu)n where n is an integer.

In one embodiment, an array of patterned MTJ elements is formed along a row in which each MTJ contacts a different bottom electrode that is connected to electrical circuits in a sub-structure through a via formed in a first dielectric layer. The MTJ elements are embedded in a MTJ interlevel dielectric (ILD) layer which is coplanar with a top surface of a capping layer in each MTJ. Moreover, there is an array of second conductive lines formed in the first dielectric layer such that a second conductive line is aligned below each MTJ and orthogonal to the first conductive line, and is electrically separated from a bottom electrode. In the exemplary embodiment, the spacing control layer is formed by a so called Damascene process described by the following sequence. A second dielectric layer is deposited on the MTJ ILD and on the top surface of the capping layer which have flat and coplanar surfaces as a result of a previous chemical mechanical polish (CMP) process. A photoresist patterning step and an etch transfer process are employed to form a trench that is aligned above each of the MTJ elements in the row of MTJs. The etch transfer step may involve a reactive ion etch (RIE) to selectively remove portions of the second dielectric layer above the MTJ elements and thereby uncover the capping layer in each MTJ. The photoresist is removed and then a seed layer is deposited on the capping layer in each MTJ and on the second dielectric layer. Thereafter, the highly conductive material used to form the spacing control layer is plated on the seed layer. A CMP process is used to planarize the spacing control layer so that it becomes coplanar with the second dielectric layer.

The cladding layer and first conductive line are subsequently formed by the following steps. A third dielectric layer is deposited on the second dielectric layer and on the spacing control layer. A second photoresist patterning and etch sequence forms a trench opening in the third dielectric layer that uncovers the spacing control layer. Then the second photoresist is stripped and cladding material is deposited on the spacing control layer, on the two sidewalls in the trench opening, and on the surface of the third dielectric layer but does not fill the trench. Next, a sputter etch is employed to redeposit the cladding material from the bottom of the trench to the sidewalls of the trench opening such that there is no magnetic material on the spacing control layer except proximate to the interface of the trench sidewalls with the spacing control layer. The first conductive line is electroplated to fill the trench opening followed by a second CMP step to form a top surface of the first conductive line that is coplanar with the third dielectric layer. A portion of the cladding layer remains between the first conductive line and the third dielectric layer along the sides of the first conductive line that are perpendicular to the top surface of the spacing control layer. Thereafter, the magnetic cladding material is deposited on the first conductive line and on the third dielectric layer. A conventional patterning and etching sequence is followed to form a third side of the cladding layer that faces away from the MTJ elements.

According to a second embodiment, a spacing control layer is formed between a cladded word line below a bottom electrode and a MTJ element with a top pinned layer configuration to control the spacing between the cladded word line side wall and free layer in the MTJ.

In a third embodiment, a first spacing control layer is formed between a cladded bit line and a MTJ with dual pinned layers and a second spacing control layer is formed between a cladded word line and the aforementioned MTJ such that a first distance between a free layer and cladded bit line is controlled and a second distance between the free layer and the cladded word line is controlled.

In a fourth embodiment, a first spacing control layer is formed between a cladded bit line and a single pinned layer MTJ element and a second spacing control layer is formed between a cladded word line and the single pinned layer MTJ to control a first distance between the free layer and the cladded bit line and a second distance between the free layer and cladded word line.

BRIEF DESCRIPTION OF THE DRAWINGS

FIG. 1 is a cross-sectional view showing a conventional MRAM structure in which an MTJ is formed between a first conductive line and a second conductive line.

FIG. 2 is a cross-sectional view of the MRAM in FIG. 1 that has been modified with a magnetic cladding layer on three sides of the first and second conductive lines.

FIG. 3 is a cross-sectional view of a conventional MRAM design in which a cladding layer on a conductive line contacts a capping layer in a MTJ element which can lead to a half-select bit disturb problem when the spacing between the cladding layer and the free layer in the MTJ is thinned below a certain value.

FIG. 4 is a graph showing the measured error count per 4 Mb chip after a 1000× bit line write disturb for a MTJ with a c-like shape where a cladding layer contacts the capping layer on the MTJ free layer and the spacing between cladding layer and free layer is thinned below a certain value.

DETAILED DESCRIPTION OF THE INVENTION

Figure 5A:
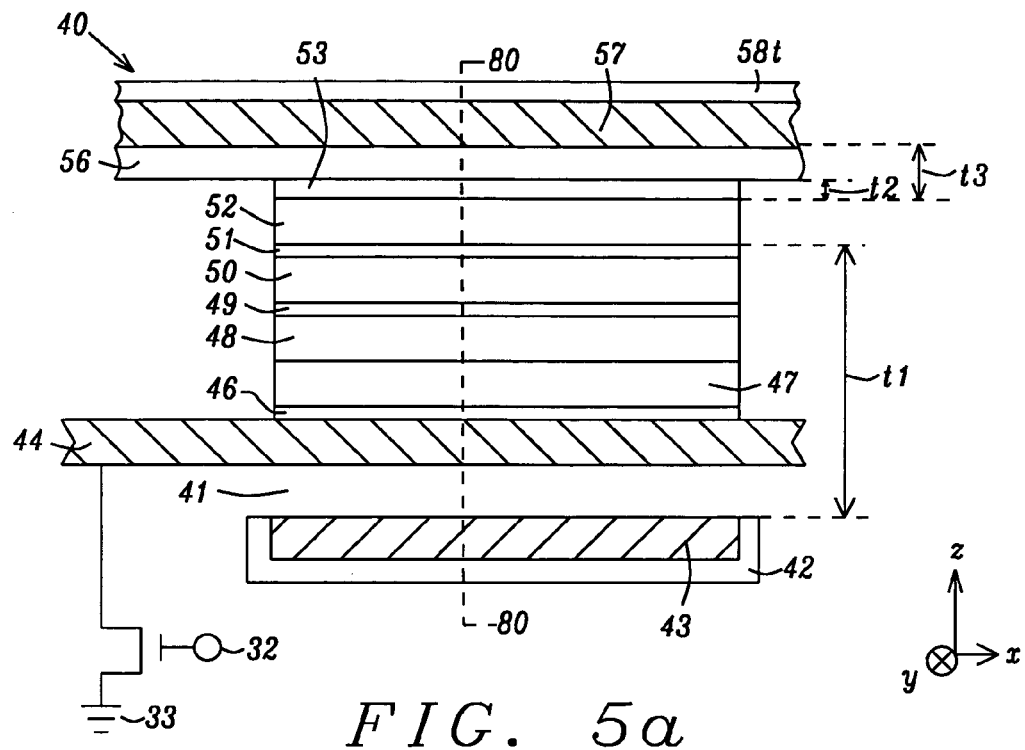
FIG. 5a is a cross-sectional view along a y-axis of a MRAM structure and FIG. 5b is a cross-sectional view of the same MRAM along an x-axis according to an embodiment of the present invention wherein a spacing control layer which is part of a cladded bit line structure is inserted between a row of MTJ elements having a bottom pinned layer configuration and a cladded bit line.

The present invention is a MRAM structure that includes a row of MTJ elements and at least one spacing control layer as part of a cladded conductive line that is formed between each MTJ and the conductive line used to switch the magnetization in a free layer within at least one of the MTJs in the row of MTJ elements. Although the exemplary embodiment depicts a cladded bit line formed above a MTJ having a bottom pinned layer structure, and a cladded word line below the MTJ, the designation for bit line and word line may be reversed. Moreover, the terms bit line and word line may be interchanged with other terms such as column line, row line, data line, and digit line. According to various embodiments described herein, the MTJ element may have a top pinned layer, a bottom pinned layer, or a dual pinned layer configuration as appreciated by those skilled in the art. Although only one MRAM cell and one MTJ element are shown in the drawings, it should be understood that there is a plurality of MRAM cells in an array that has multiple rows intersecting with multiple columns on an MRAM chip. Furthermore, the tunnel barrier layer that enables a tunneling magnetoresistive (TMR) effect in a MTJ element of the present invention may be replaced with a non-magnetic spacer such as Cu to enable a giant magnetoresistive (GMR) effect. The present invention is also a method of forming a cladded conductive line structure that comprises a cladding layer formed on three sides of a conductive line that do not face a MTJ element and a spacing control layer that contacts a side of the conductive line facing the MTJ element.

Referring to FIG. 5a, one embodiment of the present invention is depicted that shows a MRAM structure 40 comprised of a MTJ stack of layers 46-53 formed on a bottom electrode 44 from a view along the y-axis which extends in and out of the plane of the paper. The bottom electrode 44 is connected to a transistor 32 which in turn is connected to ground 33. Aligned below the bottom electrode 44 and MTJ stack of layers 46-53 is a word line 43 which in the exemplary embodiment is embedded in a dielectric layer 41. The dielectric layer 41 is formed on a substructure (not shown) comprised of silicon or another semiconductor material used in the art. In one aspect, the word line 43 is enclosed on three sides by a cladding layer 42 which is made of a magnetic material such as NiFe, Co, Fe, Ni, or alloys thereof. A side of the word line facing the bottom electrode 44 does not have an adjoining cladding layer. According to one embodiment, the MTJ is comprised of a seed layer 46, AFM layer 47, a synthetic anti-parallel (SyAP) pinned layer (including AP2 layer 48, coupling layer 49, and AP1 layer 50), a tunnel barrier layer 51, free layer 52, and a non-magnetic capping layer 53 that are sequentially formed on the bottom electrode in a bottom pinned layer configuration. The spacing between the bottom surface of the free layer 52 and the word line 43 is the distance t1 and is substantially greater than the distance t3 between bit line 57 and the top surface of the free layer. Free layer 52 is a ferromagnetic layer with a magnetization in the x-axis direction, for example, and capping layer 53 may be comprised of one or more of Ru, Ta, Cu, or other metals or metal alloys to provide excellent electrical contact with an overlying conductive line and to serve as a CMP stop layer in a CMP planarization step during fabrication of the MRAM 40.

In one aspect, the patterned MTJ element with layers 46-53 has a ellipse, oval, or eye shape, for example, from a top view (not shown) along the z-axis which is perpendicular to the planes of the MTJ layers. When the patterned MTJ has a non-symmetrical shape from a top view, the easy axis is typically along a long axis direction and the hard axis is aligned along a short axis direction. In an alternative embodiment, the MTJ element with layers 46-53 may have a "c-like" shape from a top view as explained in detail in related patent application Ser. No. 11/787,330.

Figure 5B:
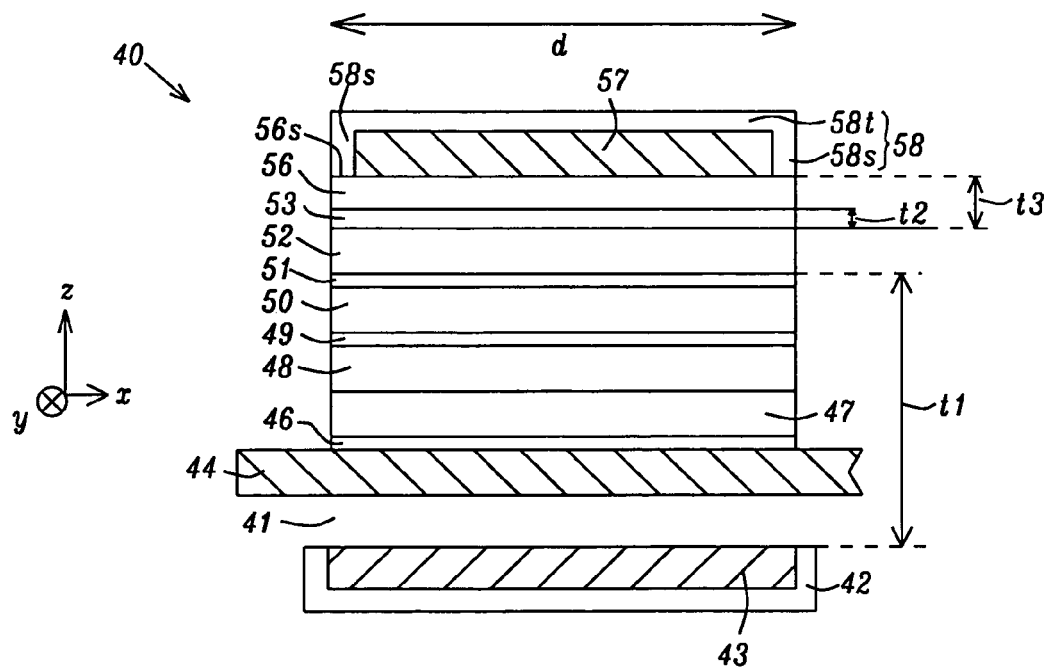

A key feature of the present invention is the spacing control layer 56 that adjoins bit line 57. There is a cladding layer formed on three sides of bit line 57, and a spacing control layer 56 which contacts a fourth side of the bit line 57 facing the capping layer 53. Spacing control layer 56 is considered to be part of cladded bit line 57 but is shown with a separate numerical designation. Only a top section 58t of the cladding layer formed on a side of the bit line facing away from the MTJ element is shown from the perspective in FIG. 5a. Furthermore, top cladding section 58t may be comprised of a seed layer (not shown) made of a highly conductive nitride of Si, Al, Mg, Hf, Ti, Ta, or Cu that is used to promote cladding material deposition on bit line 57. As illustrated in FIG. 5b which is a view along the x-axis direction from a plane 80-80 (FIG. 5a), cladding layer 58 comprises a top portion 58t on a side of the bit line 57 opposite the capping layer 53, and two sides 58s formed along sides of the bit line that are oriented perpendicular to a top surface of the capping layer 53. A lower tip of each cladding layer side 58s contacts a top surface 56s of the spacing control layer. Cladding layer 58 may be made of the same magnetic material as in cladding layer 42 and has a thickness from 20 to 800 Angstroms.

Spacing control layer 56 is preferably a non-magnetic, low resistivity, and highly conductive material selected from but not limited to Cu, Al, Au, Ag, CuAg, Ta, Cr, NiCr, NiFeCr, Ru, Rh, W, and multi-layers or laminates thereof such as (NiCr/Cu)n where n is an integer. It should be understood that the bit line 57, cladding layer 58, and spacing control layer 56 extend in a direction in and out of the plane of the paper and the spacing control layer contacts a capping layer in each of a plurality of MTJ elements along a row of MTJ elements (not shown). Spacing control layer 56 extends for a substantial distance along bit line 57. In one aspect, spacing control layer adjoins bit line 57 along an entire row of MTJ elements in a MRAM array but may not extend beyond the row of MTJs or MRAM cells into a region where the bit line connects with other wiring in the MRAM device. Furthermore, MTJ layers 46-53, spacing control layer 56, bit line 57, and cladding layer 58 are embedded in a plurality of dielectric layers that are not shown in order to simplify the drawing. One or more of the plurality of dielectric layers may be comprised of an oxide, nitride, or oxynitride of Si, Al, Mg, Hf, Ta, or Ti.

In one embodiment, the bit line 57 and spacing control layer 56 are comprised of the same highly conductive material. However, the present invention also anticipates that bit line 57 may be comprised of a conductive material that is different than the conductive material in spacing control layer 56. In the exemplary embodiment, the width d of the cladding layer 58 is essentially the same as the width of spacing control layer 56 in the y-axis direction. The present invention also encompasses an embodiment wherein the width d is different than the width of the spacing control layer in the y-axis direction.

In all embodiments relating to a bottom pinned layer configuration, the distance t3 between the free layer 52 and bit line 57 and cladding layer sides 58s must be maintained within a certain range. Note that the thickness t2 of the capping layer 53 plus the thickness of the spacing control layer 56 equals the distance t3 between bit line 57 and free layer 52. Those skilled in the art will recognize that distance t3 must be tightly controlled for optimum magnetic performance in MRAM cell 40. If t3 becomes too large, then the magnetic field generated by bit line 57 on free layer 52 during a switching operation is reduced and writing efficiency is diminished which requires a higher (undesirable) writing current in bit line 57. On the other hand, if t3 becomes too small, the magnetic coupling between cladding sides 58s and free layer 52 will be strong enough to cause half-select bit errors and degradation in magnetic behavior. In particular, we have found t3 must be maintained between 0.03 and 0.15 microns for optimum MRAM performance. Preferably, the thickness of spacing control layer is kept between 0.02 and 0.12 microns. An advantage of the cladded bit line structure described herein is that the capping layer 53 and spacing control layer 56 are formed in separate steps. Thus, if capping layer 53 has a thickness t2 larger or smaller than a target value, the spacing control layer 56 thickness may be adjusted accordingly to keep the value t3 in the desired range mentioned above.

In one embodiment, spacing control layer 56 may comprise a seed layer (not shown) that contacts the top surface of capping layer 53. A seed layer is typically included to promote the deposition of spacing control layer 56. Preferably, the seed layer is a highly conductive material selected from but not limited to a metal such as Si, Al, Mg, Hf, Ti, Ta, and Cu, or a nitride thereof.

Figure 6:
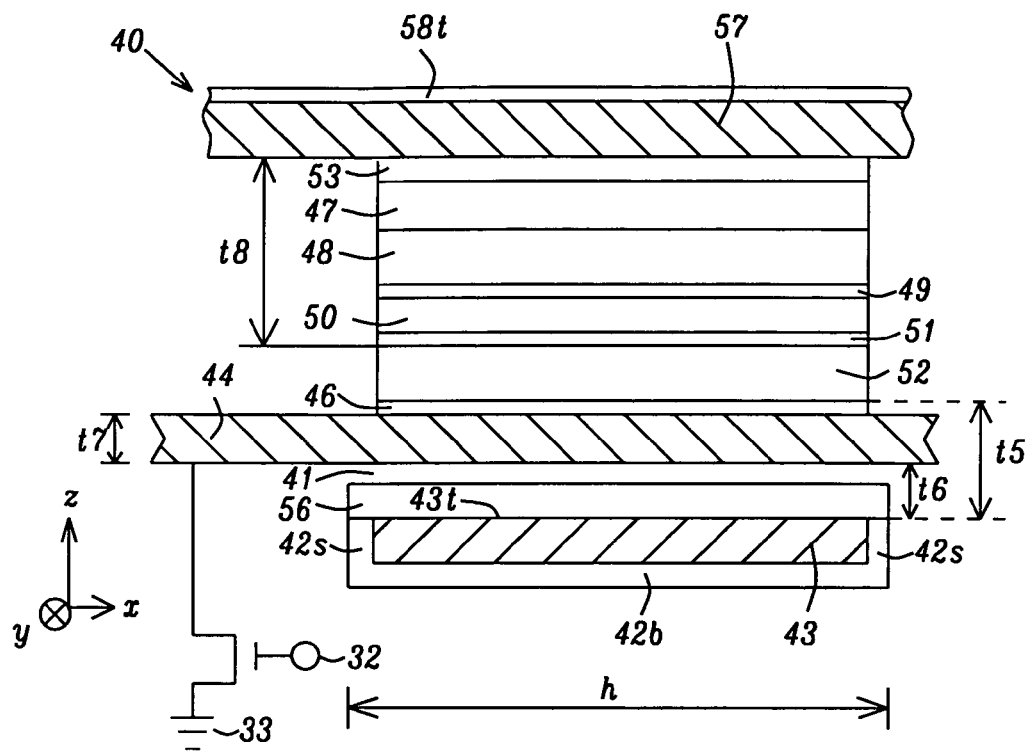
FIG. 6 is a cross-sectional view of a MRAM structure according to a second embodiment of the present invention wherein a spacing control layer as part of a cladded word line structure is inserted between a row of MTJ elements having a top pinned layer configuration and a cladded word line aligned below a bottom electrode.

The present invention also encompasses a second embodiment wherein a spacing control layer 56 is formed between a cladded word line and a free layer in a MTJ element with a top pinned layer configuration. In FIG. 6, MRAM cell 40 is modified to show a MTJ stack of layers in which a seed layer 46, free layer 52, tunnel barrier layer 51, AP1 layer 50, coupling layer 49, AP2 layer 48, AFM layer 47, and capping layer 53 are sequentially formed with a top pinned layer structure on BE 44. Cladded bit line 57 contacts a top surface of capping layer 53. In this MRAM structure, free layer 52 is located closer to word line 42 than to bit line 57 (t5<t8). Thus, the spacing control layer 56 is formed between word line 42 and free layer 52 in order to control the distance t5 within a certain range of 0.03 to 0.15 microns.

In the exemplary embodiment, a bottom surface of spacing control layer 56 contacts a top side 43t of word line 43 that faces BE 44. There is a thin section of dielectric layer 41 between the spacing control layer 56 and the bottom electrode to avoid electrical contact between word line 43 and BE 44. Although the width h of the spacing control layer 56 is shown as essentially equivalent to the width of the MTJ layers 46-53 along the x-axis direction, the present invention also anticipates that the width h may be different than the width of MTJ layer 46-53. Note that the combined thickness t6 of the spacing control layer and dielectric layer 41, thickness t7 of BE 44, and the thickness of the seed layer 46 are added together to equal the distance t5.

In one aspect, cladding sides 42s are formed along sides of word line 43 that are aligned perpendicular to BE 44. There is a cladding layer section 42b contacting a side of word line 43 that faces away from BE 44. It is important that cladding layer section 42b connect with cladding sides 42s so that the two sides and bottom surface of the word line is covered with cladding material which may be comprised of the same magnetic material in cladding sides 58s and top cladding layer 58t in the first embodiment. The thickness of top cladding section 58t and bottom cladding section 42b (in a z-axis direction) and cladding sides 42s (in an x-axis direction) is between 20 and 800 Angstroms. Similar to the first embodiment, spacing control layer 56 may comprise a seed layer (not shown) formed on the top surface 43t to promote deposition of the spacing control layer 56 which is a high conductive, low resistivity, non-magnetic material as described previously. Therefore, spacing control layer 56 is aligned below a plurality of BE 44 and below a row of MTJ elements (not shown) in a MRAM array. The distance t5 is kept sufficiently large enough such that the magnetic coupling between cladding sides 42s and free layer 52 does not become too large and cause a half-select bit error. Moreover, t5 is not allowed to become so large that a typical magnetic field generated by a relatively low write current in word line 42 (and a second write current in bit line 57) is not strong enough to switch the magnetization in free layer 52. Preferably, spacing control layer thickness is kept in the range of 0.02 to 0.12 microns.

Figure 7:
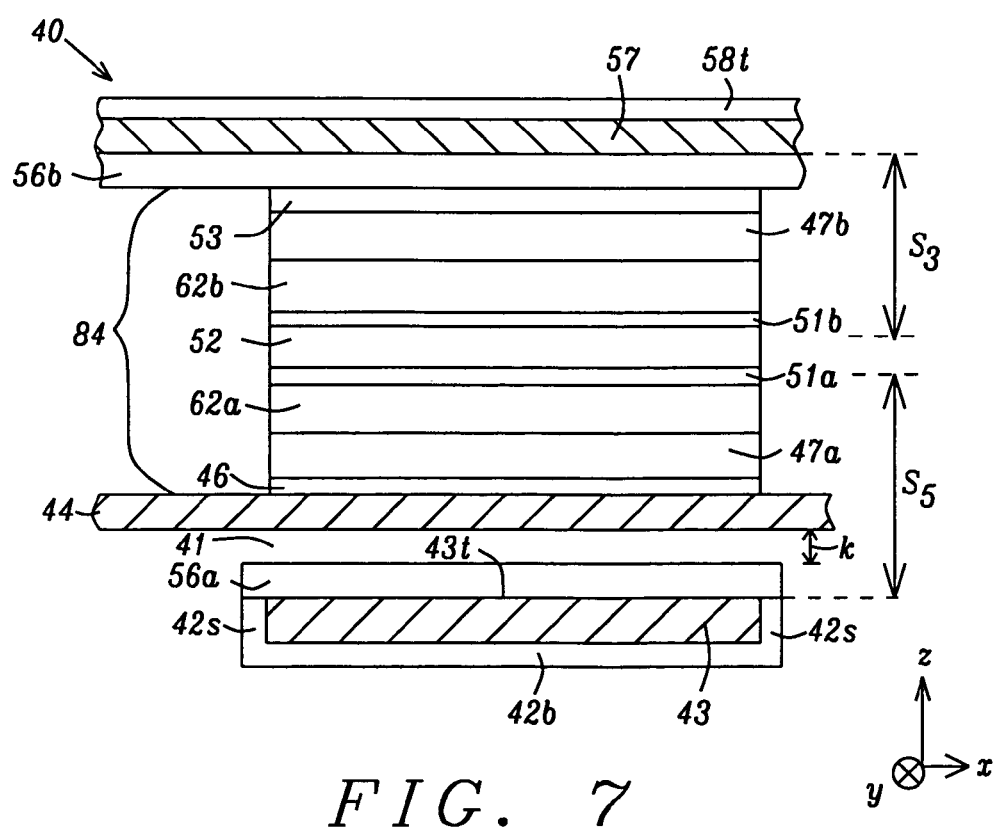
FIG. 7 is a cross-sectional view of a MRAM structure according to a third embodiment of the present invention wherein a first spacing control layer is formed between a MTJ and a cladded bit line, and a second spacing control layer is formed between the MTJ and a cladded word line that is orthogonal to the cladded bit line.

According to a third embodiment in FIG. 7 that relates to a MTJ with a dual pinned layer structure comprised of a pinned layer and a tunnel barrier layer on either side of a free layer, a first spacing control layer is formed between a top surface of a capping layer and a cladded bit line as in the first embodiment and a second spacing control layer is inserted between a cladded word line and the lower surface of a bottom electrode as depicted in the second embodiment.

There is a word line 43 enclosed on two sides by cladding sidewalls 42s and by a bottom cladding section 42b on a side opposite the MTJ 84 with a dual pinned layer configuration. A first spacing control layer 56a is formed between BE 44 and a top surface 43t of word line 43. Spacing control layer 56a is separated from BE 44 by a thin portion of dielectric layer 41 with a thickness k of 100 to 1000 Angstroms. Cladding sides 42s, bottom cladding section 42b, word line 43, and first spacing control layer 56a all have a lengthwise direction along the y-axis and a width in the x-axis direction. First spacing control layer 56a has the same composition as described previously for spacing control layer 56 in the first two embodiments. In this case, first spacing control layer 56a has a thickness between 0.02 and 0.12 microns to maintain a distance $s_5$ of 0.03 to 0.15 microns between the word line top surface 43t and a lower surface of free layer 52.

MTJ 84 with a dual pinned layer structure has a seed layer 46, first AFM layer 47a, first pinned layer 62a, first tunnel barrier 51a, free layer 52, second tunnel barrier 51b, second pinned layer 62b, second AFM layer 47b, and capping layer 53 sequentially formed on BE 44. Pinned layers 62a, 62b may each have a SyAF configuration including AP1 and AP2 layers separated by a coupling layer as appreciated by those skilled in the art. Furthermore, one or both of the tunnel barrier layers 51a, 51b may be replaced by a non-magnetic spacer such as Cu.

A second spacing control layer 56b is formed between a top surface 53s of capping layer 53 and a side of bit line 57 facing the top surface 53s as described with respect to spacing control layer 56 in the first embodiment. In this case, the second spacing control layer 56b is used to control the distance $s_3$ between bit line 57 and a top surface of free layer 52. Second spacing control layer 56b has a thickness between 0.02 and 0.12 microns to maintain a distance $s_3$ of 0.03 to 0.15 microns between the bit line 57 and free layer 52, and is preferably comprised of the same highly conductive non-magnetic material as in spacing control layer 56 described previously.

Figure 8:
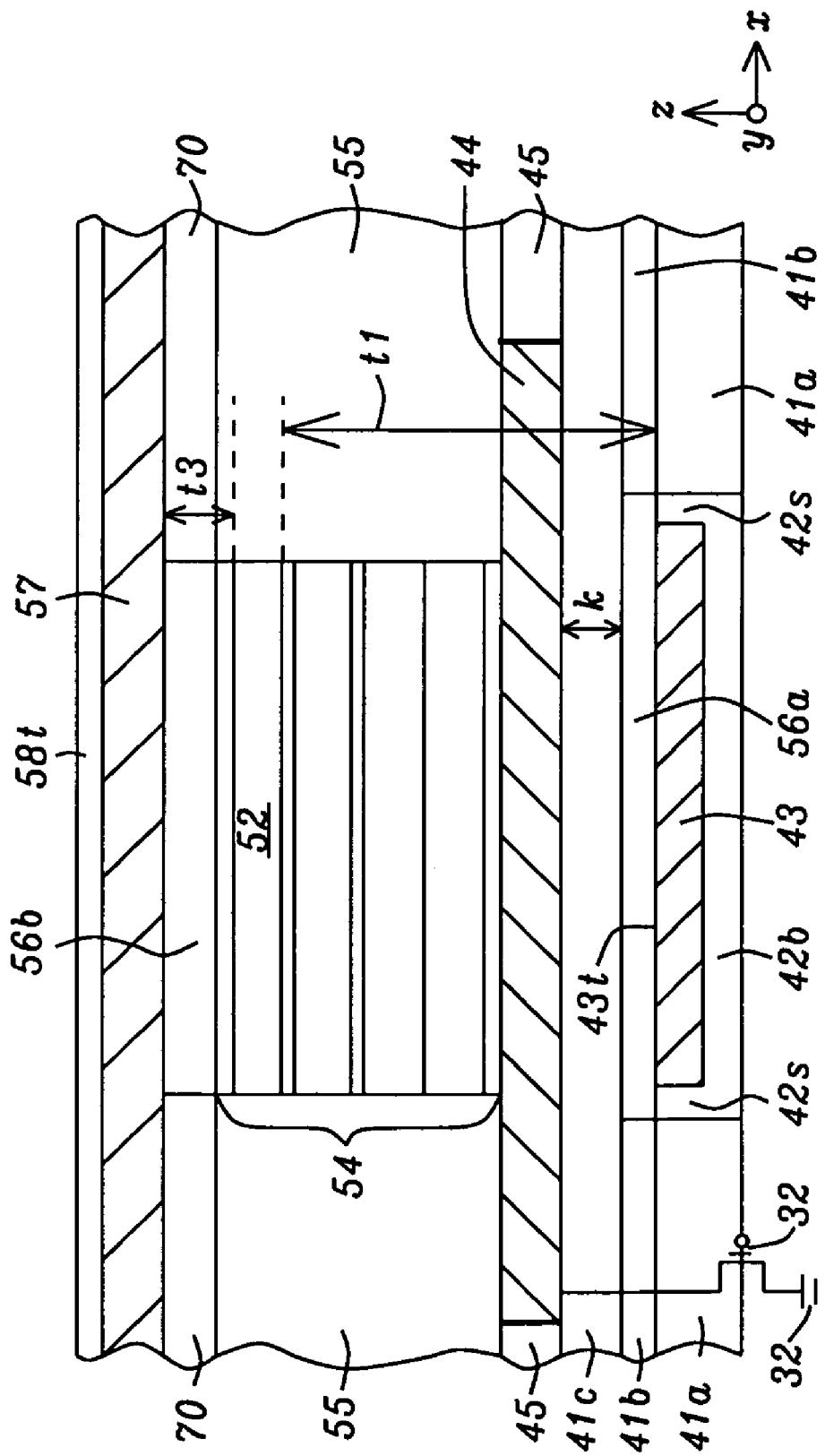
FIG. 8 is a cross-sectional view of a MRAM structure according to a fourth embodiment of the present invention which represents a single pinned layer MTJ structure wherein a first spacing control layer is formed between a MTJ and a cladded bit line, and a second spacing control layer is formed between the MTJ and a cladded word line that is orthogonal to the cladded bit line.

A fourth embodiment of the present invention is depicted in FIG. 8 and represents a modification of the third embodiment where the dual pinned layer MTJ element 84 is replaced by a single pinned layer MTJ element 54. Although the exemplary embodiment depicts a bottom pinned layer configuration for MTJ 54, the present invention also encompasses a top pinned layer configuration. In this embodiment, the first spacing control layer 56a maintains the distance t1 between the free layer 52 and cladded word line 43 within a certain range and second spacing control layer 56b maintains the distance t3 between the free layer and cladded bit line 57 within a certain range. In general, with a single pinned layer, the minimum value in only one of the t1 and t3 distances needs to be carefully controlled to prevent half-select errors since t1 is usually significantly greater than 0.03 microns in a bottom pinned layer configuration. Likewise, t3 is normally significantly greater than 0.03 microns in a top pinned layer configuration in which the free layer is formed on the seed layer 46 proximate to BE 44. Note that dielectric layer 41 is depicted as a composite of three dielectric layers in this embodiment. A lower dielectric layer 41a is coplanar with the top surface 43t of word line 43. Above dielectric layer 41a is a dielectric layer 41b that is coplanar with first spacing control layer 56a. There is a dielectric layer 41c formed between first spacing control layer 56a and BE 44 to electrically isolate the aforementioned conductive elements. Each of the dielectric layers 41a-41c, 45, 55, 70 may be comprised of an oxide, nitride, or oxynitride of Si, Al, Mg, Hf, Ta, or Ti.

Figure 9:
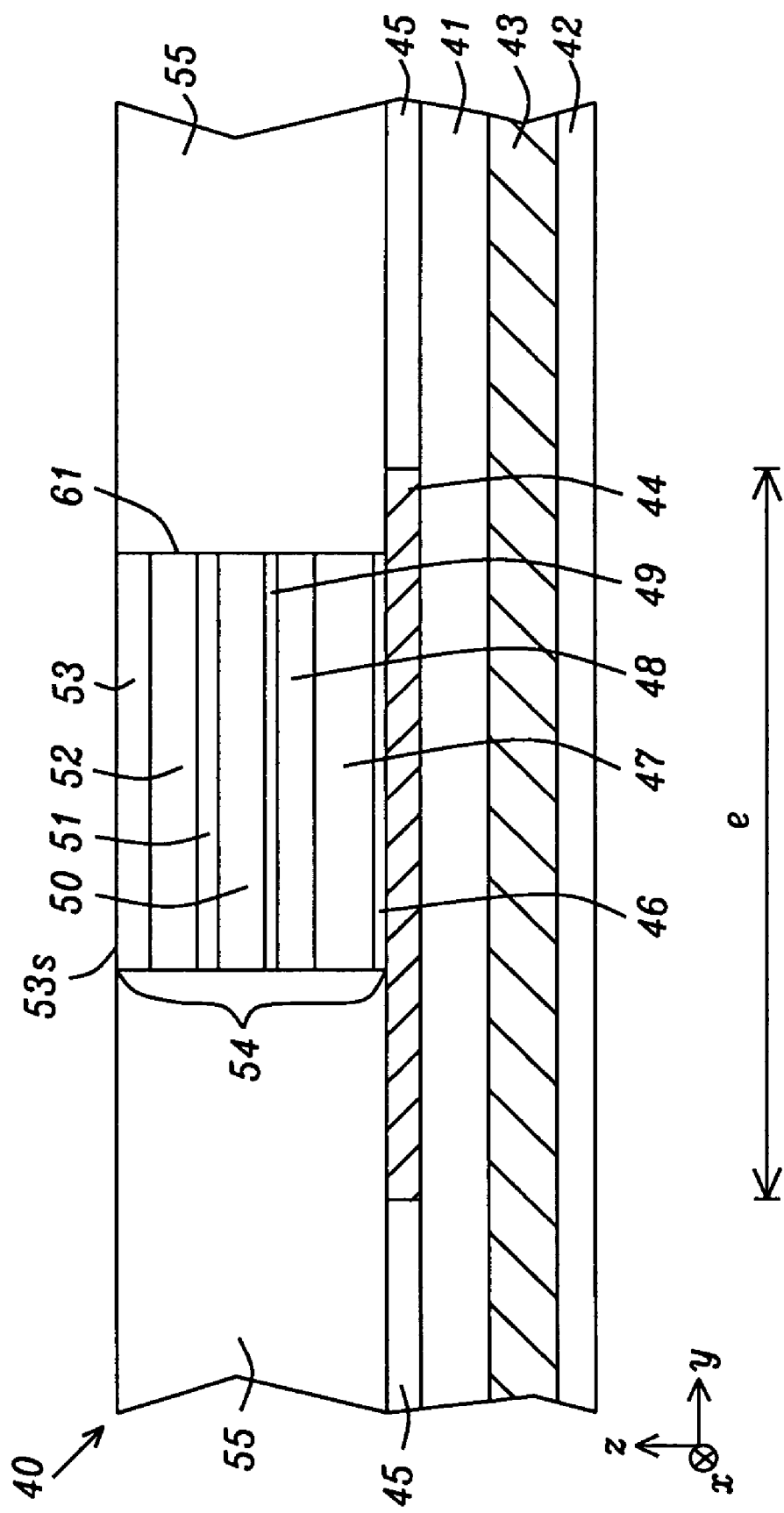
FIGS. 9-15 are cross-sectional views that illustrate a fabrication process used to form a spacing control layer between a row of MTJ elements and a cladding layer on a bit line or word line according to an embodiment of the present invention.

Referring to FIG. 9, a first step in the fabrication process to form a cladded conductive line structure in MRAM 40 as described with regard to FIG. 5b is shown. As indicated earlier, the cladded conductive line structure of the present invention and in particular the spacing control layer is designed independently of the materials and configuration used for MTJ layers 46-53 (hereafter referred to as MTJ 54) and the layers in the substrate below the MTJ element. According to one embodiment, the electrical connection of MTJ 54 to an underlying substructure is accomplished through via (not shown) that contacts a bottom surface of bottom electrode 44. The via is usually not placed directly below MTJ 54 so that the via does not intersect a word line or spacing control layer. In one aspect, the bottom electrode has a width e in a y-axis direction that is greater than the width of any of the MTJ layers 46-53 along the y-axis direction.

In the exemplary embodiment, bottom electrode (BE) 44 is formed within and is coplanar with a BE ILD layer 45. MTJ 54 has a bottom pinned layer configuration with a seed layer 46 contacting a top surface of BE 44 and is embedded within a MTJ ILD layer 55. MTJ 54 is shown with essentially vertical sidewalls 61. However, in an alternative embodiment, MTJ 54 may have sloped sidewalls such that the bottom seed layer 46 has a greater width along the y-axis than the capping layer 53. A top surface 53s of capping layer 53 is formed coplanar with the MTJ ILD layer 55 usually by a CMP process that removes an upper portion of both of the aforementioned layers.

Figure 10:
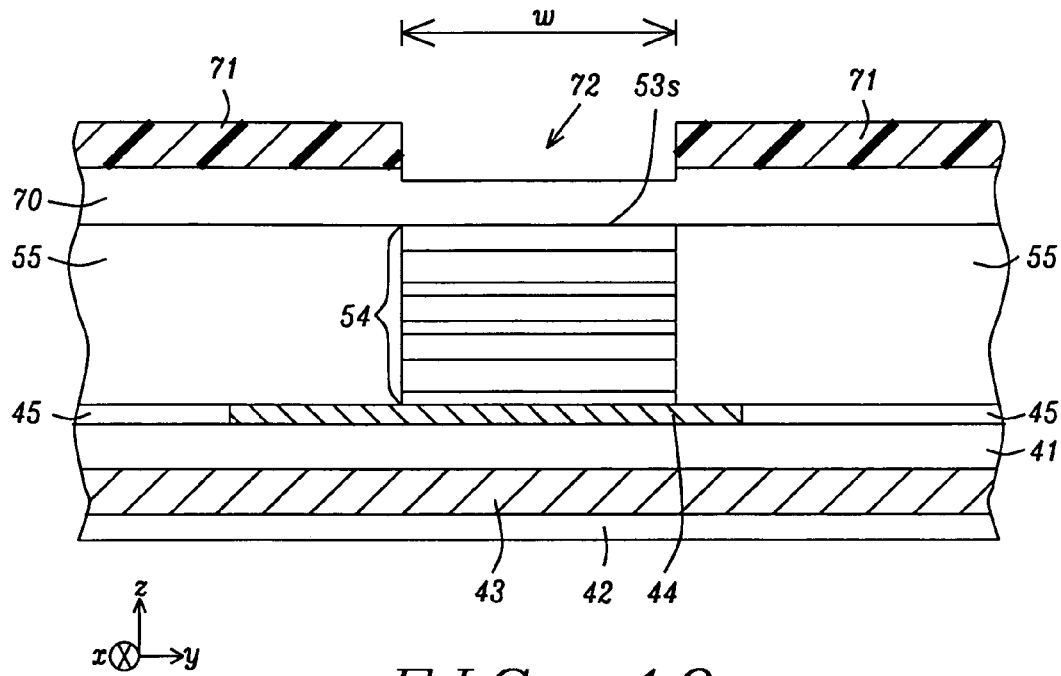

Referring to FIG. 10, a dielectric layer 70 which may be an oxide, nitride, or oxynitride of Si, Al, Mg, Hf, Ta, or Ti is deposited by a chemical vapor deposition (CVD) or physical vapor deposition (PVD) method on MTJ ILD layer 55 and on the top surface 53s of capping layer 53. A photoresist layer 71 is coated on dielectric layer 70 and is patterned by a conventional photo patterning process to form a trench opening 72 which is aligned above MTJ 54 and has a width w which is not necessarily the same as that of the MTJ layers in the y-axis direction. Trench opening 72 extends in a (+) and (−) x-axis direction above a plurality of MTJ elements in a row of MRAM cells 40. A reactive ion etch (RIE) step is performed to transfer the opening through the dielectric layer 70. FIG. 7 illustrates an intermediate point in the RIE process where the trench opening 72 has been partially transferred through dielectric layer 70. The RIE process continues until trench opening 72 uncovers the top surface 53s which serves as an etch stop. Photoresist layer 71 is then stripped by a well known process.

Figure 11:
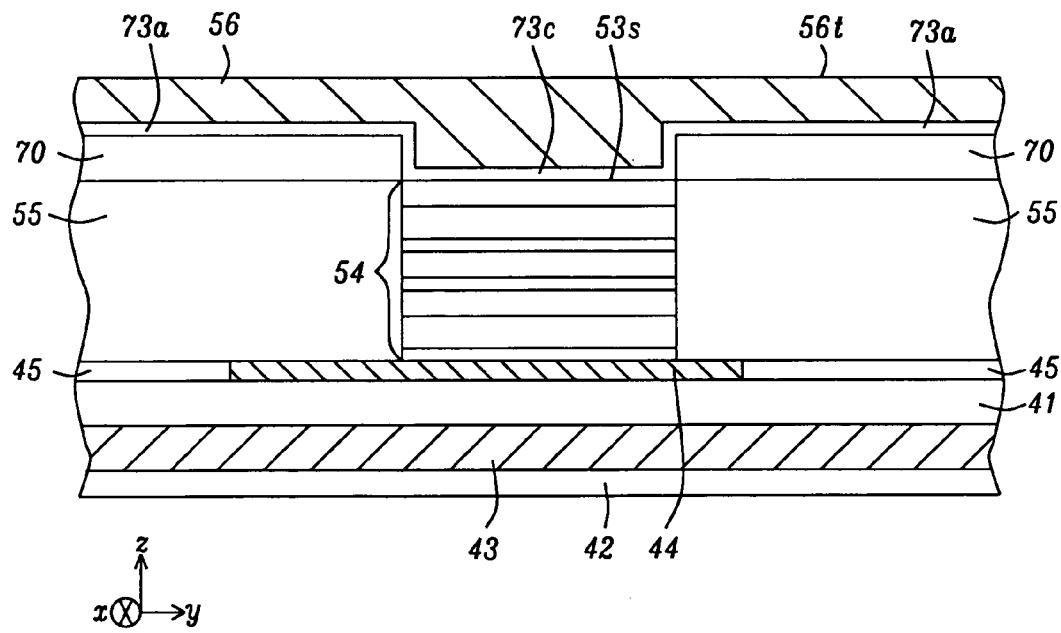

Referring to FIG. 11, a sputter deposition method is performed to deposit a first seed layer comprised of seed layer section 73c which contacts top surface 53s at the bottom of trench opening 72 and sidewalls of dielectric layer 70, and seed layer sections 73a formed on a top surface of dielectric layer 70. Seed layer sections 73a, 73c may be made of a Cu, Al, Ta, or Si, or a nitride thereof, for example. Next, the spacing control layer 56 is preferably deposited on seed layer section 73c to fill the trench opening 72 and on seed layer sections 73a by an electroplating method. A top surface 56t of the spacing control layer 56 is not necessarily planar after deposition.

Figure 12:
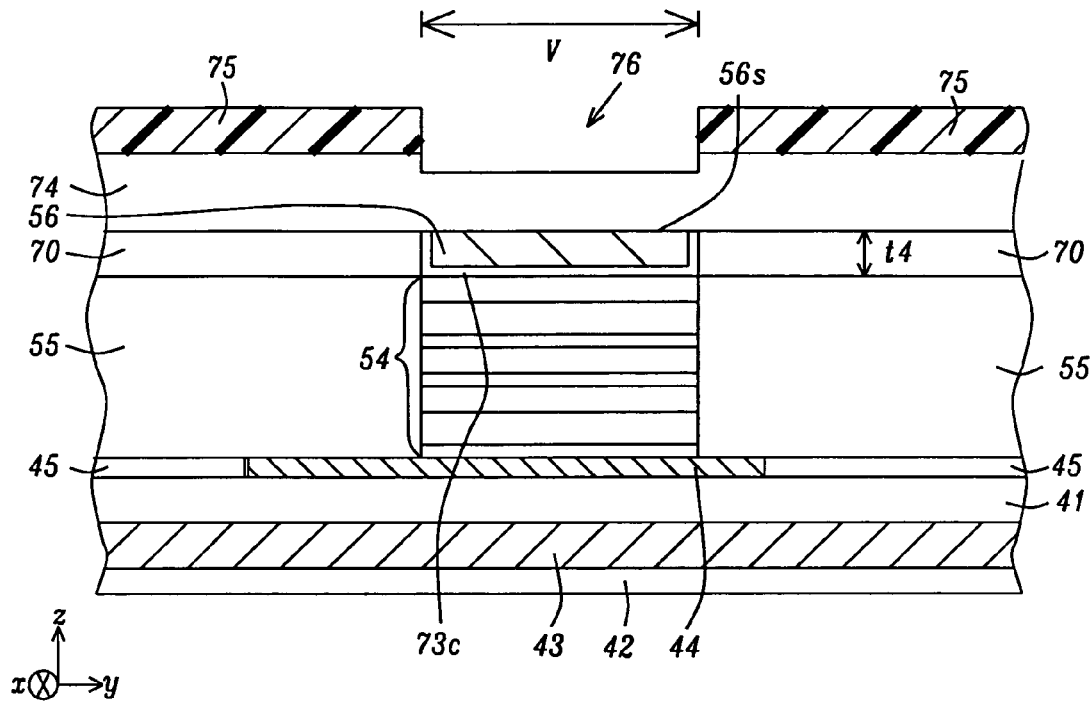

Referring to FIG. 12, a CMP process is employed to remove a top portion of the spacing control layer 56 and seed layer sections 73a so that a top surface 56s of the spacing control layer becomes coplanar with dielectric layer 70. The process sequence including the steps mentioned with regard to FIG. 10 and FIG. 11 in addition to the CMP process to form a planar top surface 56s represent a damascene process that is employed for forming a spacing control layer in a dielectric layer.

Thereafter, a bit line ILD layer 74 is deposited on dielectric layer 70 and on spacing control layer 56 by a CVD or PVD method, for example. Then a second photoresist layer 75 is coated and patterned on the bit line ILD layer 74 to form an opening 76 having a width v. The opening 76 is then transferred through the bit line ILD layer 74 preferably by a RIE process. In one aspect, v may not necessarily be the same as width w of the spacing control layer 56 and may be either larger or smaller than the width w. It is important that the center of the trench 76 be aligned as closely as possible with the center of spacing control layer and MTJ 54 so that when a current is applied in a subsequently deposited bit line in trench 76, the resulting magnetic field will have a maximum switching effect on the free layer in MTJ 54. It should be understood that FIG. 12 represents an intermediate point in the RIE process to form a trench 76. The etch process is continued until the entire top surface 56s of spacing control layer 56 is uncovered. Thereafter, second photoresist layer 75 is stripped. Note that the seed layer section 73c may be included in spacing control layer 56 as indicated previously. Thus, the composite seed layer 73c/spacing control layer 56 may alternatively be shown as simply spacing control layer 56 as in FIGS. 5a, 5b.

Figure 13:
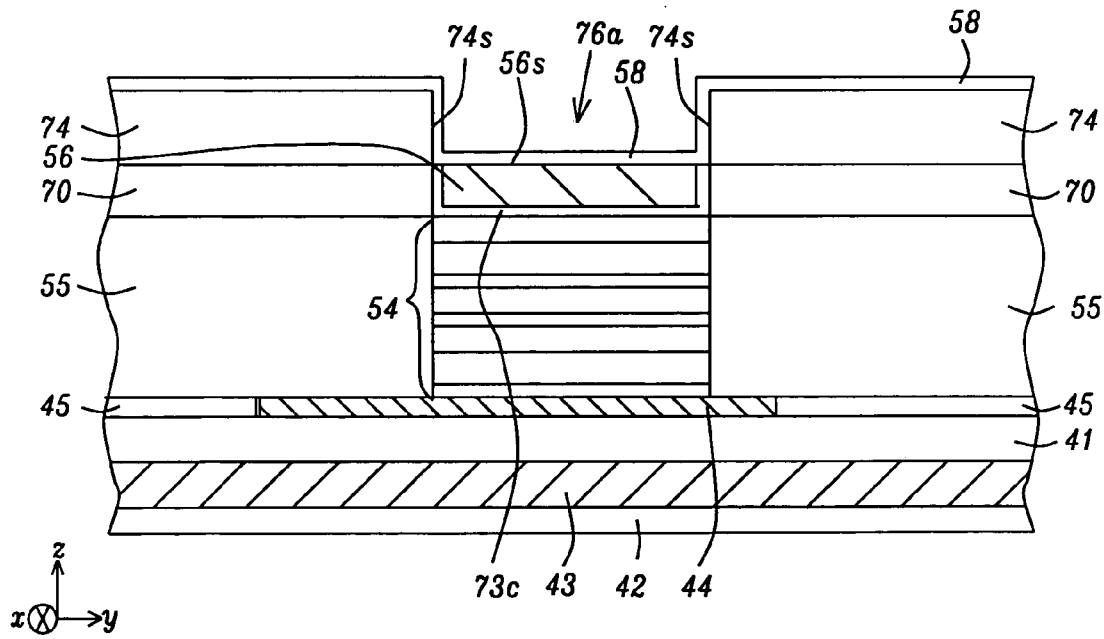

Referring to FIG. 13, a second seed layer (not shown) with a composition as described previously with regard to seed layer 73a, 73c may be deposited on the top surface 56s of spacing control layer in trench opening 76 and on a top surface of bit line ILD layer 74. A cladding layer 58 is then formed on the bottom of trench 76, along sidewalls 74s, and on the top surface of bit line ILD layer 74 by a method such as sputter deposition. Cladding layer 58 has a thickness from 20 to 800 Angstroms and is comprised of NiFe, Ni, Fe, Co, or alloys thereof. Bit line ILD layer 74 has sidewalls 74s along the partially filled trench opening 76a.

Figure 14:
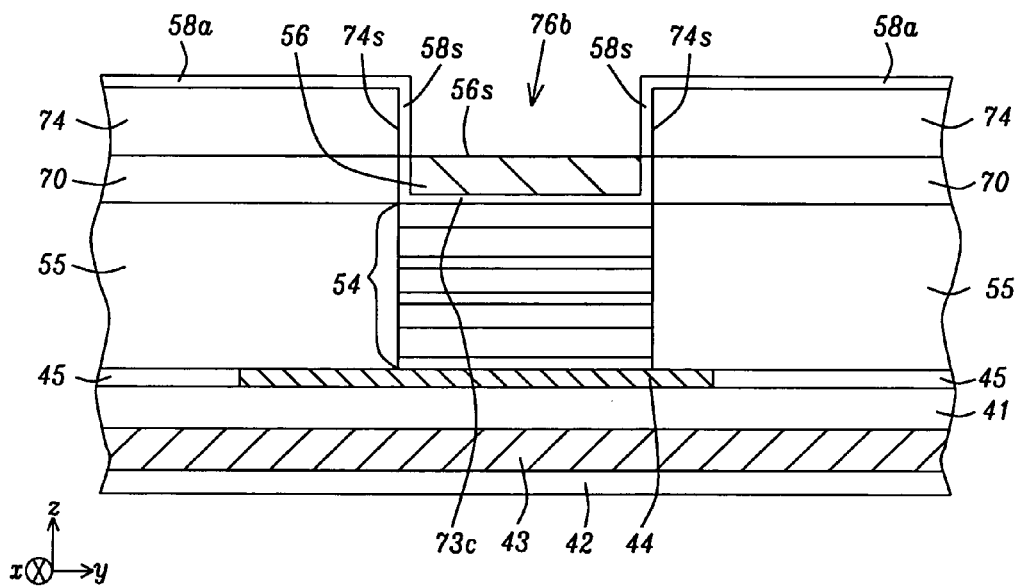

Referring to FIG. 14, a sputter etch process involving Ar or another inert gas is used to redeposit the cladding layer 58 from the bottom of the trench opening 76a to along sidewalls 74s to provide a trench opening 76b. In other words, cladding sidewalls 58s are formed along sidewalls 74s, and top surface 56s is uncovered except where cladding sidewalls 58s contact spacing control layer 56. Cladding layer 58a on a top surface of bit line ILD layer 74 may have a different thickness after the sputter etch process than originally deposited cladding layer 58.

Figure 15:
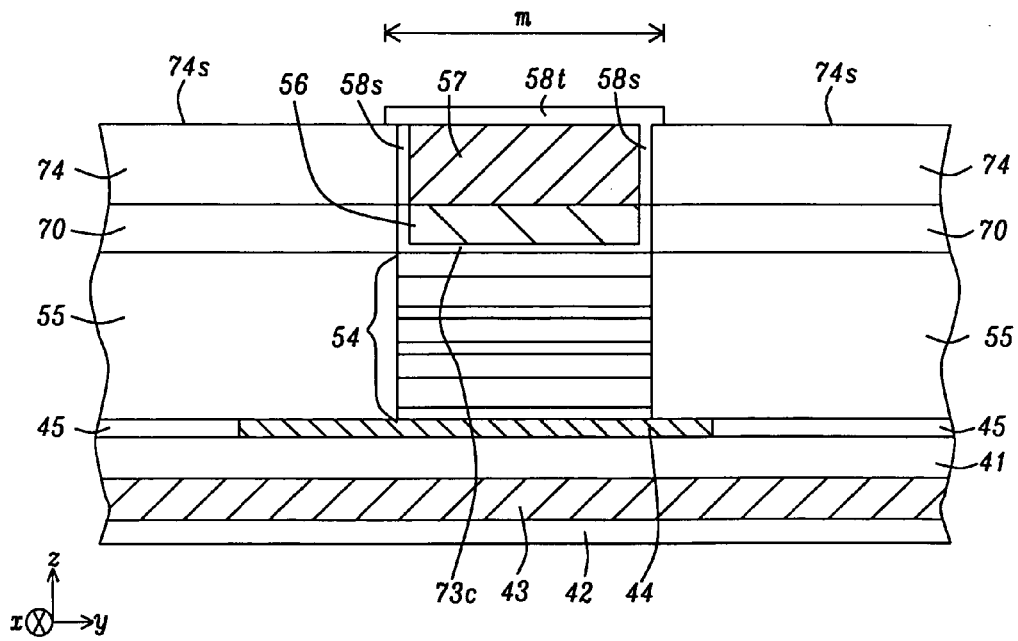

Referring to FIG. 15, a plating seed layer (not shown) is preferably formed on the top surface 56s of spacing control layer 56 and on cladding layer 58a. In the following step, a bit line 57 is electroplated on the plating seed layer to a level that fills trench opening 76b. Subsequently, a CMP process is used to remove a top portion of the bit line 57 such that the bit line become coplanar with a top surface 74s of the bit line ILD layer 74 and with a top surface of cladding sidewalls 58s. Next, a cladding layer 58t is formed on cladding sides 58s and contacting the entire top surface of bit line 57. Typically, a seed layer and cladding material may be sequentially deposited on the entire substrate and then selectively removed by a photoresist patterning and etch sequence except in desired regions over bit line 57 and cladding sides 58s. Although the cladding layer 58t is shown as having a width m greater than the width of the bit line and cladding sides 58s, the width m may also be essentially the same as that of v (FIG. 12) and w (FIG. 10). However, the width m must not be less than v or w to avoid leaving a portion of bit line 57 uncovered by cladding material.

Those skilled in the art will recognize that a spacing control layer 56 in the second embodiment or a first spacing control layer 56a in the third and fourth embodiments may be formed by the same set of processes as described with regard to FIGS. 9-15. For example, in the fourth embodiment (FIG. 8), a dielectric layer 41b may be deposited on word line 43 by a CVD or PVD method. Then a photoresist patterning and etching sequence is used to generate a trench opening (not shown) that uncovers the word line. The photoresist is stripped and then a seed layer is formed on the word line 43 followed by a plating operation to deposit the spacing control layer 56a. Subsequently, a CMP process is employed to make the spacing control layer coplanar with the dielectric layer 41b. Next, a dielectric layer 41c is deposited on dielectric layer 41b and spacing control layer 56a. Then BE 44 and dielectric layer 45 may be formed on dielectric layer 41c.

The advantage of the cladded conductive line structure of the present invention is that the distance between a free layer in a MTJ and a cladded bit line and/or the free layer and a cladded word line is tightly controlled so that high writing efficiency is maintained without enabling a half-select bit error problem to occur. In other words, the cladding structure enables the bit line or word line to be close enough to provide a strong magnetic field at the free layer for switching purposes but a spacing control layer prevents strong magnetic coupling between the cladding material and free layer that could lead to half-select bit disturbance issues. Furthermore, there is flexibility in the fabrication process by forming the capping layer and spacing control layer in separate steps so that the combined thickness of the capping layer and spacing control layer can be easily adjusted.

While this invention has been particularly shown and described with reference to, the preferred embodiment thereof, it will be understood by those skilled in the art that various changes in form and details may be made without departing from the spirit and scope of this invention.

We claim:

1. A MRAM structure including a row of MRAM cells wherein each MRAM cell has a magnetic tunnel junction (MTJ) element in which a distance between a free layer in a MTJ element and a tip of a cladding layer formed along sidewalls of a conductive line used to switch a magnetic state in said free layer is well controlled, comprising:
   (a) a patterned MTJ element with an uppermost non-magnetic capping layer formed coplanar with a dielectric layer;
   (b) a conductive line that is aligned above and maintained a certain distance from a free layer in each of the MTJ elements in the row of MRAM cells, said conductive line is used to switch a magnetic state within a free layer in at least one of said MTJ elements when a write current is applied to the conductive line;
   (c) a cladding structure, comprising:
      (1) cladding sidewalls comprised of a magnetic material and formed on each of two sides of the conductive line that are aligned in a direction perpendicular to a top surface of each of the MTJ elements; and
      (2) a top cladding layer comprising a magnetic material and formed on a side of the conductive line that faces away from the MTJ elements, said top cladding layer is connected to said cladding sidewalls; and
   (d) a spacing control layer which is part of the conductive line and extends a substantial distance along the conductive line, said spacing control layer is comprised of a highly conductive and non-magnetic material having a side that contacts the top surface in each of said MTJ elements and an opposite side that contacts the cladded conductive line.

2. The MRAM structure of claim 1 wherein the spacing control layer has a thickness between about 0.02 and 0.12 microns.

3. The MRAM structure of claim 1 wherein the highly conductive and non-magnetic material of the spacing control layer is comprised of Cu, Al, Au, Ag, CuAg, Ta, Cr, NiCr, NiFeCr, Ru, Rh, W, or multi-layers or laminates thereof.

4. The MRAM structure of claim 1 wherein said certain distance is from about 0.03 to 0.15 microns.

5. The MRAM structure of claim 1 wherein the cladding sides and top cladding layer have a thickness between about 20 and 800 Angstroms.

6. The MRAM structure of claim 1 wherein the cladding structure is embedded in a dielectric layer comprised of an oxide, nitride, or oxynitride of Si, Al, Mg, Hf, Ta, or Ti.

7. The MRAM structure of claim 1 wherein the top cladding layer and spacing control layer further comprise a seed layer made of a highly conductive metal which is one of Si, Al, Mg, Hf, Ti, Ta, or Cu, or a highly conductive nitride thereof.

8. The MRAM structure of claim 1 wherein said MTJ element has an ellipse, oval, eye shape, or "c-like" shape from a top view along an axis perpendicular to the top surface of the MTJ element.

9. The MRAM structure of claim 1 wherein each of said MTJ elements has a bottom pinned layer configuration in which a capping layer is formed between the free layer and the spacing control layer.

10. A MRAM structure including a row of MRAM cells wherein each MRAM cell has a magnetic tunnel junction (MTJ) element in which a distance between a free layer in a MTJ element and a tip of a cladding layer formed along sidewalls of a conductive line used to switch a magnetic state in said free layer is well controlled, comprising:
   (a) a conductive line that is aligned below and maintained a first distance from the free layer in each of the MTJ elements in the row of MRAM cells, said conductive line is used to switch a magnetic state within a free layer in at least one of said MTJ elements when a write current is applied to the conductive line;
   (b) a cladding structure, comprising:
      (1) cladding sidewalls comprised of a magnetic material and formed on each of two sides of the conductive line that are aligned in a direction perpendicular to a bottom surface of each of the MTJ elements; and
      (2) a bottom cladding layer comprising a magnetic material and formed on a side of the conductive line that faces away from the MTJ elements, said bottom cladding layer is connected to said cladding sidewalls; and
   (c) a spacing control layer which is part of the conductive line and extends a substantial distance along the conductive line, said spacing control layer is comprised of a highly conductive and non-magnetic material that is formed within in a dielectric layer and spaced a second distance from a bottom surface of a bottom electrode in each of said MTJ elements, said spacing control layer has a side facing away from the MTJ elements that contacts the cladded conductive line.

11. The MRAM structure of claim 10 wherein the spacing control layer has a thickness between about 0.02 and 0.12 microns.

12. The MRAM structure of claim 10 wherein the highly conductive and non-magnetic material of the spacing control layer is comprised of Cu, Al, Au, Ag, CuAg, Ta, Cr, NiCr, NiFeCr, Ru, Rh, W, or multi-layers or laminates thereof.

13. The MRAM structure of claim 10 wherein said first distance is from about 0.03 to 0.15 microns.

14. The MRAM structure of claim 10 wherein the cladding sides and bottom cladding layer have a thickness between about 20 and 800 Angstroms.

15. The MRAM structure of claim 10 wherein the cladding structure is embedded in a dielectric layer comprised of an oxide, nitride, or oxynitride of Si, Al, Mg, Hf, Ta, or Ti.

16. The MRAM structure of claim 10 wherein the spacing control layer further comprises a seed layer made of a highly conductive metal which is one of Si, Al, Mg, Hf, Ti, Ta, or Cu, or is a highly conductive nitride thereof.

17. The MRAM structure of claim 10 wherein said MTJ element has an ellipse, oval, eye shape, or "c-like" shape from a top view along an axis perpendicular to the top surface of the MTJ element.

18. The MRAM structure of claim 10 wherein each of said MTJ elements has a top pinned layer configuration and a dielectric layer with a thickness equal to said second distance is formed between the spacing control layer and the bottom electrode in each of said MTJ elements to electrically isolate the bottom electrode and MTJ elements from the word line.

19. A MRAM structure including a MTJ element within a MRAM cell formed at the intersection of a first row of MRAM cells and a first column of MRAM cells wherein a first distance between a free layer in the MTJ element and a tip of a cladding layer formed along sidewalls of a first conductive line and a second distance between the free layer and a tip of a cladding layer formed along sidewalls of a second conductive line are well controlled, comprising:
(a) a patterned MTJ element with an uppermost non-magnetic capping layer formed coplanar with a dielectric layer;
(b) a first conductive line that is aligned above and maintained a certain distance from the free layer in each of the MTJ elements in the first row of MRAM cells, said first conductive line is used to switch a magnetic state with said free layer in said MTJ element when a first write current is applied to the first conductive line;
(c) a second conductive line that is orthogonal to the first conductive line and is aligned below and maintained a certain distance from the free layer in each of the MTJ elements in the first column of MRAM cells, said second conductive line is used to switch the magnetic state within said free layer in said MTJ element when a second write current is applied to the second conductive line;
(d) a first cladding structure, comprising:
  (1) a first pair of cladding sidewalls comprising a magnetic material and formed on each of two sides of the first conductive line that are aligned in a direction perpendicular to a top surface of each of the MTJ elements; and
  (2) a top cladding layer comprising a magnetic material and formed on a side of the first conductive line facing away from the MTJ elements, said top cladding layer is connected to said first pair of cladding sidewalls;
(e) a first spacing control layer which is part of the first conductive line and extends a substantial distance along the first conductive line, said first spacing control layer is comprised of a highly conductive and non-magnetic material that contacts a top surface of each MTJ element in said first row of MRAM cells and having an opposite side that contacts the cladded first conductive line;
(f) a second cladding structure, comprising:
  (1) a second pair of cladding sidewalls comprising a magnetic material and formed on each of two sides of the second conductive line that are aligned in a direction perpendicular to a bottom surface of each of the MTJ elements is said first column of MRAM cells; and
  (2) a bottom cladding layer comprising a magnetic material and formed on a side of the second conductive line that faces away from the MTJ elements, said bottom cladding layer is connected to said second pair of cladding sidewalls; and
(g) a second spacing control layer which is part of the second conductive line and extends a substantial distance along the second conductive line, said second spacing control layer is comprised comprising a highly conductive and non-magnetic material that is formed within a dielectric layer and spaced a second distance from a bottom surface of a bottom electrode in each of said MTJ elements in said first column of MRAM cells, said second spacing control layer has a side facing away from the MTJ elements that contacts the cladded second conductive line.

20. The MRAM structure of claim 19 wherein the highly conductive and non-magnetic material of the first spacing control layer and second spacing control layer is comprised of Cu, Al, Au, Ag, CuAg, Ta, Cr, NiCr, NiFeCr, Ru, Rh, W, or multi-layers or laminates thereof.

21. The MRAM structure of claim 19 wherein the first and second pairs of cladding sides, bottom cladding layer, and top cladding layer are comprised of NiFe, Co, Fe, Ni, or alloys thereof and have a thickness between about 20 and 800 Angstroms.

22. The MRAM structure of claim 19 wherein the first cladding structure, second cladding structure, first spacing control layer, and second spacing control layer are each embedded in a dielectric layer comprised of an oxide, nitride, or oxynitride of Si, Al, Mg, Hf, Ta, or Ti.

23. The MRAM structure of claim 19 wherein the first and second spacing control layers are further comprised of a seed layer made of a highly conductive metal that is one of Si, Al, Mg, Hf, Ti, Ta, or Cu, or is a highly conductive nitride thereof.

24. The MRAM structure of claim 19 wherein each of said MTJ elements has an ellipse, oval, eye shape, or "c-like" shape from a top view along an axis perpendicular to the top surface of the MTJ element.

25. A method of forming a MRAM structure; comprising:
(a) providing a substrate comprised of a first dielectric layer and a MTJ element having a free layer and an uppermost capping layer, said MTJ element has a bottom surface contacting a bottom electrode and a top surface that is formed by a CMP process to be coplanar with a top surface of said first dielectric layer;
(b) forming a spacing control layer with a Damascene process, comprising:
  (1) depositing a second dielectric layer on said substrate and forming a first trench opening with sidewalls therein that uncovers the top surface of said MTJ element;
  (2) depositing a metal seed layer on said sidewalls, on the second dielectric layer and on the top surface of the MTJ element, and then plating a highly conductive and non-magnetic material to fill said first trench opening; and
  (3) removing a top portion of the second dielectric layer and of the highly conductive and non-magnetic material to give a spacing control layer having a well controlled thickness;
(c) depositing a third dielectric layer on the second dielectric layer and on the spacing control layer and forming a second trench opening with sidewalls therein that uncovers a top surface of said spacing control layer;
(d) depositing a cladding material on the spacing control layer and on a top surface of the third dielectric layer;
(e) sputter etching to redeposit the cladding material on the spacing control layer to the sidewalls of said second trench opening thereby forming two cladding sidewalls;
(f) forming a conductive line which fills the second trench opening and contacts the top surface of said spacing control layer;
(g) performing a CMP process to remove a top portion of said third dielectric layer and of said conductive line to give a conductive line having a top surface that is coplanar with a top surface of the third dielectric layer, two sides aligned perpendicular to the substrate and adjoining the two cladding sidewalls, and a bottom surface formed a certain distance from the top surface of the MTJ element; and (h) forming a top cladding layer that covers a side of the conductive line facing away from said MTJ element, said top cladding layer contacts each of the two cladding sidewalls.

26. The method of claim 25 wherein the MRAM structure further comprises a row of MRAM cells each including a MTJ element that contacts a bottom electrode, and said spacing control layer contacts a top surface of each of the MTJ elements in said row.

27. The method of claim 25 wherein the MTJ element has an ellipse, circular, eye, or "c-like" shape from a top down view along an axis perpendicular to the top surface of said MTJ element.

28. The method of claim 25 wherein the MTJ element has a top pinned layer, bottom pinned layer, or dual pinned layer configuration.

29. The method of claim 25 wherein each of the first, second, and third dielectric layers are comprised of an oxide, nitride, or oxynitride of Si, Al, Mg, Hf, Ta, or Ti.

30. The method of claim 25 wherein the cladding sidewalls and top cladding layer are comprised of NiFe, Ni, Co, Fe, or alloys thereof and have a thickness between about 20 and 800 Angstroms.

31. The method of claim 25 wherein said metal seed layer is made of Si, Al, Mg, Hf, Ti, Ta, or Cu or a highly conductive nitride thereof.

32. The method of claim 25 wherein the spacing control layer is comprised of Cu, Al, Au, Ag, CuAg, Ta, Cr, NiCr, NiFeCr, Ru, Rh, W, or multi-layers or laminates thereof.

33. The method of claim 25 wherein said certain distance is from about 0.03 to 0.15 microns.

34. The method of claim 25 wherein the spacing control layer has a thickness between about 0.02 and 0.12 microns.

* * * * *

UNITED STATES PATENT AND TRADEMARK OFFICE
CERTIFICATE OF CORRECTION

PATENT NO. : 8,169,816 B2
APPLICATION NO. : 12/584952
DATED : May 1, 2012
INVENTOR(S) : Tai Min et al.

It is certified that error appears in the above-identified patent and that said Letters Patent is hereby corrected as shown below:

Title Page,

In the Title (54), delete "Fabrication Methods Of Partial Cladded Write Line to Enhance Write Margin For Magnetic Random Access Memory" and replace with -- Design And Fabrication Methods Of Partial Cladded Write Line To Enhance Write Margin For Magnetic Random Access Memory --.

In the Inventors (75), delete third Inventor "David Heim, Redwood City, CA (US)" and replace with -- David E. Heim, Redwood City, CA (US) --.

Signed and Sealed this
Thirty-first Day of July, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,169,816 B2 | |
| APPLICATION NO. | : 12/584952 | |
| DATED | : May 1, 2012 | |
| INVENTOR(S) | : Tai Min et al. | |

It is certified that error appears in the above-identified patent and that said Letters Patent is hereby corrected as shown below:

Title Page, Item (54) and at Column 1, lines 1-4,

In the Title, delete "Fabrication Methods Of Partial Cladded Write Line to Enhance Write Margin For Magnetic Random Access Memory" and replace with -- Design And Fabrication Methods Of Partial Cladded Write Line To Enhance Write Margin For Magnetic Random Access Memory --.

In the Inventors (75), delete third Inventor "David Heim, Redwood City, CA (US)" and replace with -- David E. Heim, Redwood City, CA (US) --.

This certificate supersedes the Certificate of Correction issued July 31, 2012.

Signed and Sealed this
Twenty-eighth Day of August, 2012

David J. Kappos
*Director of the United States Patent and Trademark Office*